US009849831B2

(12) United States Patent
Salter et al.

(10) Patent No.: US 9,849,831 B2
(45) Date of Patent: Dec. 26, 2017

(54) PRINTED LED STORAGE COMPARTMENT

(71) Applicant: Ford Global Technologies, LLC, Dearborn, MI (US)

(72) Inventors: Stuart C. Salter, White Lake, MI (US); James J. Surman, Clinton Township, MI (US); Pietro Buttolo, Dearborn Heights, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 14/733,023

(22) Filed: Jun. 8, 2015

(65) Prior Publication Data

US 2015/0298603 A1 Oct. 22, 2015

Related U.S. Application Data

(63) Continuation-in-part of application No. 14/603,636, filed on Jan. 23, 2015, now Pat. No. 9,573,517, which
(Continued)

(51) Int. Cl.
| | |
|---|---|
| *B60Q 3/225* | (2017.01) |
| *B60Q 3/68* | (2017.01) |
| *H05B 37/02* | (2006.01) |
| *B60Q 3/82* | (2017.01) |
| *B60Q 3/233* | (2017.01) |

(Continued)

(52) U.S. Cl.
CPC ............... *B60Q 3/68* (2017.02); *B60Q 3/225* (2017.02); *B60Q 3/233* (2017.02); *B60Q 3/80* (2017.02); *B60Q 3/82* (2017.02); *H05B 37/0218* (2013.01); *H05B 37/0227* (2013.01); *B60Q 3/78* (2017.02); *H05K 3/4664* (2013.01); *H05K 2201/0108* (2013.01); *H05K 2201/10106* (2013.01);
(Continued)

(58) Field of Classification Search
CPC .. B60Q 3/0286; B60Q 3/0289; B60Q 3/0293; B60Q 3/0223; B60Q 3/022; H05K 1/181; H05K 2201/0108; H05K 2201/10106; H05K 3/4664; Y02B 20/445; Y02B 20/46; Y02B 20/44; H05B 37/0218; H05B 37/0227; B60L 1/14
See application file for complete search history.

(56) References Cited

U.S. PATENT DOCUMENTS

| | | |
|---|---|---|
| 2,486,859 A | 11/1949 | Meijer et al. |
| 5,053,930 A | 10/1991 | Benavides |

(Continued)

FOREIGN PATENT DOCUMENTS

| | | |
|---|---|---|
| CN | 101260982 A | 9/2008 |
| CN | 101337492 A | 1/2009 |

(Continued)

*Primary Examiner* — Elmito Breval
*Assistant Examiner* — Fatima Farokhrooz
(74) *Attorney, Agent, or Firm* — Vichit Chea; Price Heneveld LLP

(57) ABSTRACT

An illumination apparatus for a vehicle storage cavity is disclosed. The apparatus comprises a circuit disposed proximate to and extending significantly along an opening of the cavity. At least one proximity sensor and a plurality of LEDs suspended in a semiconductor ink are printed on the circuit. The circuit is configured to activate an emission from the LEDs in response to the proximity sensor detecting an object entering the storage cavity.

18 Claims, 6 Drawing Sheets

Related U.S. Application Data is a continuation-in-part of application No. 14/086,442, filed on Nov. 21, 2013.

(51) Int. Cl.
*B60Q 3/80* (2017.01)
*H05K 3/46* (2006.01)
*B60Q 3/78* (2017.01)

(52) U.S. Cl.
CPC .............. Y02B 20/44 (2013.01); Y02B 20/445 (2013.01); Y02B 20/46 (2013.01)

(56) References Cited

U.S. PATENT DOCUMENTS

| | | | |
|---|---|---|---|
| 5,709,453 A | 1/1998 | Krent et al. | |
| 5,839,718 A | 11/1998 | Hase et al. | |
| 6,031,511 A | 2/2000 | DeLuca et al. | |
| 6,117,362 A | 9/2000 | Yen et al. | |
| 6,419,854 B1 | 7/2002 | Yocom et al. | |
| 6,494,490 B1 | 12/2002 | Trantoul | |
| 6,577,073 B2 | 6/2003 | Shimizu et al. | |
| 6,656,397 B1 | 12/2003 | Hansen et al. | |
| 6,729,738 B2 | 5/2004 | Fuwausa et al. | |
| 6,737,964 B2 | 5/2004 | Samman et al. | |
| 6,761,067 B1* | 7/2004 | Capano ................. G01F 23/265 340/620 | |
| 6,773,129 B2 | 8/2004 | Anderson, Jr. et al. | |
| 6,794,728 B1* | 9/2004 | Kithil ................. B60H 1/00742 257/532 | |
| 6,820,888 B1 | 11/2004 | Griffin | |
| 6,851,840 B2 | 2/2005 | Ramamurthy et al. | |
| 6,859,148 B2 | 2/2005 | Miller | |
| 6,871,986 B2 | 3/2005 | Yamanaka et al. | |
| 6,953,536 B2 | 10/2005 | Yen et al. | |
| 6,990,922 B2 | 1/2006 | Ichikawa et al. | |
| 7,015,893 B2 | 3/2006 | Li et al. | |
| 7,150,550 B2 | 12/2006 | Bogdan et al. | |
| 7,161,472 B2 | 1/2007 | Strumolo et al. | |
| 7,213,923 B2 | 5/2007 | Liu et al. | |
| 7,216,997 B2 | 5/2007 | Anderson, Jr. | |
| 7,264,366 B2 | 9/2007 | Hulse | |
| 7,264,367 B2 | 9/2007 | Hulse | |
| 7,441,914 B2 | 10/2008 | Palmer et al. | |
| 7,501,749 B2 | 3/2009 | Takeda et al. | |
| 7,575,349 B2 | 8/2009 | Bucher et al. | |
| 7,635,212 B2 | 12/2009 | Seidler | |
| 7,745,818 B2 | 6/2010 | Sofue et al. | |
| 7,753,541 B2 | 7/2010 | Chen et al. | |
| 7,834,548 B2 | 11/2010 | Jousse et al. | |
| 7,862,220 B2* | 1/2011 | Cannon ............... B29C 45/1418 362/605 | |
| 7,987,030 B2 | 7/2011 | Flores et al. | |
| 8,016,465 B2 | 9/2011 | Egerer et al. | |
| 8,022,818 B2 | 9/2011 | la Tendresse et al. | |
| 8,044,415 B2 | 10/2011 | Messere et al. | |
| 8,066,416 B2 | 11/2011 | Bucher | |
| 8,071,988 B2 | 12/2011 | Lee et al. | |
| 8,097,843 B2 | 1/2012 | Agrawal et al. | |
| 8,120,236 B2 | 2/2012 | Auday et al. | |
| 8,136,425 B2 | 3/2012 | Bostick | |
| 8,163,201 B2 | 4/2012 | Agrawal et al. | |
| 8,178,852 B2 | 5/2012 | Kingsley et al. | |
| 8,197,105 B2 | 6/2012 | Yang | |
| 8,203,260 B2 | 6/2012 | Li et al. | |
| 8,207,511 B2 | 6/2012 | Bortz et al. | |
| 8,232,533 B2 | 7/2012 | Kingsley et al. | |
| 8,247,761 B1 | 8/2012 | Agrawal et al. | |
| 8,286,378 B2 | 10/2012 | Martin et al. | |
| 8,408,766 B2 | 4/2013 | Wilson et al. | |
| 8,415,642 B2 | 4/2013 | Kingsley et al. | |
| 8,421,811 B2 | 4/2013 | Odland et al. | |
| 8,466,438 B2 | 6/2013 | Lambert et al. | |
| 8,519,359 B2 | 8/2013 | Kingsley et al. | |
| 8,519,362 B2 | 8/2013 | Labrot et al. | |
| 8,552,848 B2 | 10/2013 | Rao et al. | |
| 8,606,430 B2 | 12/2013 | Seder et al. | |
| 8,624,716 B2 | 1/2014 | Englander | |
| 8,631,598 B2 | 1/2014 | Li et al. | |
| 8,664,624 B2 | 3/2014 | Kingsley et al. | |
| 8,683,722 B1 | 4/2014 | Cowan | |
| 8,724,054 B2 | 5/2014 | Jones | |
| 8,754,426 B2 | 6/2014 | Marx et al. | |
| 8,773,012 B2 | 7/2014 | Ryu et al. | |
| 8,846,184 B2 | 9/2014 | Agrawal et al. | |
| 8,851,694 B2 | 10/2014 | Harada | |
| 8,876,352 B2* | 11/2014 | Robbins .................. F21K 9/00 362/488 | |
| 8,952,341 B2 | 2/2015 | Kingsley et al. | |
| 9,006,751 B2 | 4/2015 | Kleo et al. | |
| 9,018,833 B2 | 4/2015 | Lowenthal et al. | |
| 9,057,021 B2 | 6/2015 | Kingsley et al. | |
| 9,065,447 B2 | 6/2015 | Buttolo et al. | |
| 9,187,034 B2 | 11/2015 | Tarahomi et al. | |
| 9,299,887 B2 | 3/2016 | Lowenthal et al. | |
| 2002/0159741 A1 | 10/2002 | Graves et al. | |
| 2002/0163792 A1 | 11/2002 | Formoso | |
| 2003/0167668 A1 | 9/2003 | Fuks et al. | |
| 2003/0179548 A1 | 9/2003 | Becker et al. | |
| 2004/0213088 A1 | 10/2004 | Fuwausa | |
| 2006/0087826 A1 | 4/2006 | Anderson, Jr. | |
| 2006/0097121 A1 | 5/2006 | Fugate | |
| 2007/0032319 A1 | 2/2007 | Tufte | |
| 2007/0284945 A1* | 12/2007 | Hein ..................... B60Q 3/217 307/10.8 | |
| 2007/0285938 A1 | 12/2007 | Palmer et al. | |
| 2007/0297045 A1 | 12/2007 | Sakai et al. | |
| 2008/0219017 A1* | 9/2008 | Cruickshank .......... B60Q 3/001 362/488 | |
| 2009/0219730 A1 | 9/2009 | Syfert et al. | |
| 2009/0251920 A1 | 10/2009 | Kino et al. | |
| 2009/0260562 A1 | 10/2009 | Folstad et al. | |
| 2009/0262515 A1 | 10/2009 | Lee et al. | |
| 2011/0012062 A1 | 1/2011 | Agrawal et al. | |
| 2012/0001406 A1 | 1/2012 | Paxton et al. | |
| 2012/0020102 A1* | 1/2012 | Lambert ................ B60K 35/00 362/503 | |
| 2012/0104954 A1 | 5/2012 | Huang | |
| 2012/0183677 A1 | 7/2012 | Agrawal et al. | |
| 2012/0235568 A1 | 9/2012 | Prodin et al. | |
| 2012/0280528 A1 | 11/2012 | Dellock et al. | |
| 2013/0092965 A1 | 4/2013 | Kijima et al. | |
| 2013/0335994 A1 | 12/2013 | Mulder et al. | |
| 2014/0029281 A1 | 1/2014 | Suckling et al. | |
| 2014/0049963 A1* | 2/2014 | McGuire ................ F21V 19/04 362/249.01 | |
| 2014/0065442 A1 | 3/2014 | Kingsley et al. | |
| 2014/0103258 A1 | 4/2014 | Agrawal et al. | |
| 2014/0167445 A1* | 6/2014 | Uebelein ............... B60J 5/0416 296/146.2 |
| 2014/0211498 A1 | 7/2014 | Cannon et al. | |
| 2014/0264396 A1 | 9/2014 | Lowenthal et al. | |
| 2014/0266666 A1 | 9/2014 | Habibi | |
| 2014/0373898 A1 | 12/2014 | Rogers et al. | |
| 2015/0046027 A1 | 2/2015 | Sura et al. | |
| 2015/0109602 A1 | 4/2015 | Martin et al. | |
| 2015/0138789 A1 | 5/2015 | Singer et al. | |
| 2015/0267881 A1 | 9/2015 | Salter et al. | |
| 2016/0016506 A1 | 1/2016 | Collins et al. | |
| 2016/0037625 A1* | 2/2016 | Huitema ................ H05K 1/028 361/749 |
| 2016/0236613 A1 | 8/2016 | Trier | |

FOREIGN PATENT DOCUMENTS

| | | |
|---|---|---|
| CN | 201169230 Y | 2/2009 |
| CN | 201193011 Y | 2/2009 |
| CN | 204127823 U | 1/2015 |
| DE | 4120677 A1 | 1/1992 |
| DE | 29708699 U1 | 7/1997 |
| DE | 10319396 A1 | 11/2004 |
| EP | 1793261 A1 | 6/2007 |
| EP | 2778209 A1 | 9/2014 |

(56) References Cited

FOREIGN PATENT DOCUMENTS

| | | | |
|---|---|---|---|
| JP | 2000159011 | A | 6/2000 |
| JP | 2007238063 | A | 9/2007 |
| KR | 20060026531 | A | 3/2006 |
| WO | 2006047306 | A1 | 5/2006 |
| WO | 2014068440 | A1 | 5/2014 |

* cited by examiner

PRINTED LED STORAGE COMPARTMENT

CROSS-REFERENCE TO RELATED APPLICATIONS

This application is a continuation-in-part of U.S. patent application Ser. No. 14/603,636, filed Jan. 23, 2015, and entitled "DOOR ILLUMINATION AND WARNING SYSTEM," now U.S. Pat. No. 9,573,517, which is a continuation-in-part of U.S. patent application Ser. No. 14/086,442, filed Nov. 21, 2013, and entitled "VEHICLE LIGHTING SYSTEM WITH PHOTOLUMINESCENT STRUCTURE." The aforementioned related applications are hereby incorporated by reference in their entirety.

FIELD OF THE INVENTION

The present disclosure generally relates to vehicle lighting systems, and more particularly, to vehicle lighting systems having thin profiles that may be operable to conform to flexible materials and/or surfaces.

BACKGROUND OF THE INVENTION

Lighting in vehicles traditionally has been applied to provide illumination for reading, vehicle entry, and operation. However, lighting may also be applied to improve vehicle features and systems to ensure that vehicle passengers, operators, and onlookers have an improved experience. Such improvements may arise from improvements in safety, visibility, aesthetics, and/or features. The disclosure provides for a lighting system operable to illuminate a portion of a vehicle and in some embodiments, may illuminate a portion of a roof of a vehicle.

SUMMARY OF THE INVENTION

According to one aspect of the present disclosure, an illumination apparatus for a vehicle is disclosed. The apparatus comprises an at least partially flexible circuit disposed on an inner surface of a storage compartment proximate an access region. A plurality of LEDs suspended in a semiconductor ink are printed on the flexible circuit. At least one proximity sensor is further printed on the flexible circuit and in communication with a controller via the flexible circuit. The controller is configured to selectively illuminate the LEDs in response to a detection of an object entering an access region by the proximity sensor.

According to another aspect of the present disclosure, an apparatus to illuminate a storage pocket is disclosed. The apparatus comprises a flexible circuit disposed proximate to and extending significantly along an opening of the storage pocket. The flexible circuit comprises at least one proximity sensor and a plurality of LEDs suspended in a semiconductor ink printed thereon. The at least one proximity sensor and the plurality of LEDs are in communication with a controller via the flexible circuit. The controller is configured to activate an emission from the LEDs in response to the proximity sensor detecting an object entering the storage pocket.

According to yet another aspect of the present disclosure, an illumination apparatus for a vehicle storage cavity is disclosed. The apparatus comprises a circuit disposed proximate to and extending significantly along an opening of the cavity. At least one proximity sensor and a plurality of LEDs suspended in a semiconductor ink are printed on the circuit. The circuit is configured to activate an emission from the LEDs in response to the proximity sensor detecting an object entering the storage cavity.

These and other aspects, objects, and features of the present disclosure will be understood and appreciated by those skilled in the art upon studying the following specification, claims, and appended drawings.

DETAILED DESCRIPTION OF THE PREFERRED EMBODIMENTS

As required, detailed embodiments of the present disclosure are disclosed herein. However, it is to be understood that the disclosed embodiments are merely exemplary of the disclosure that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present disclosure.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

Figure 1:
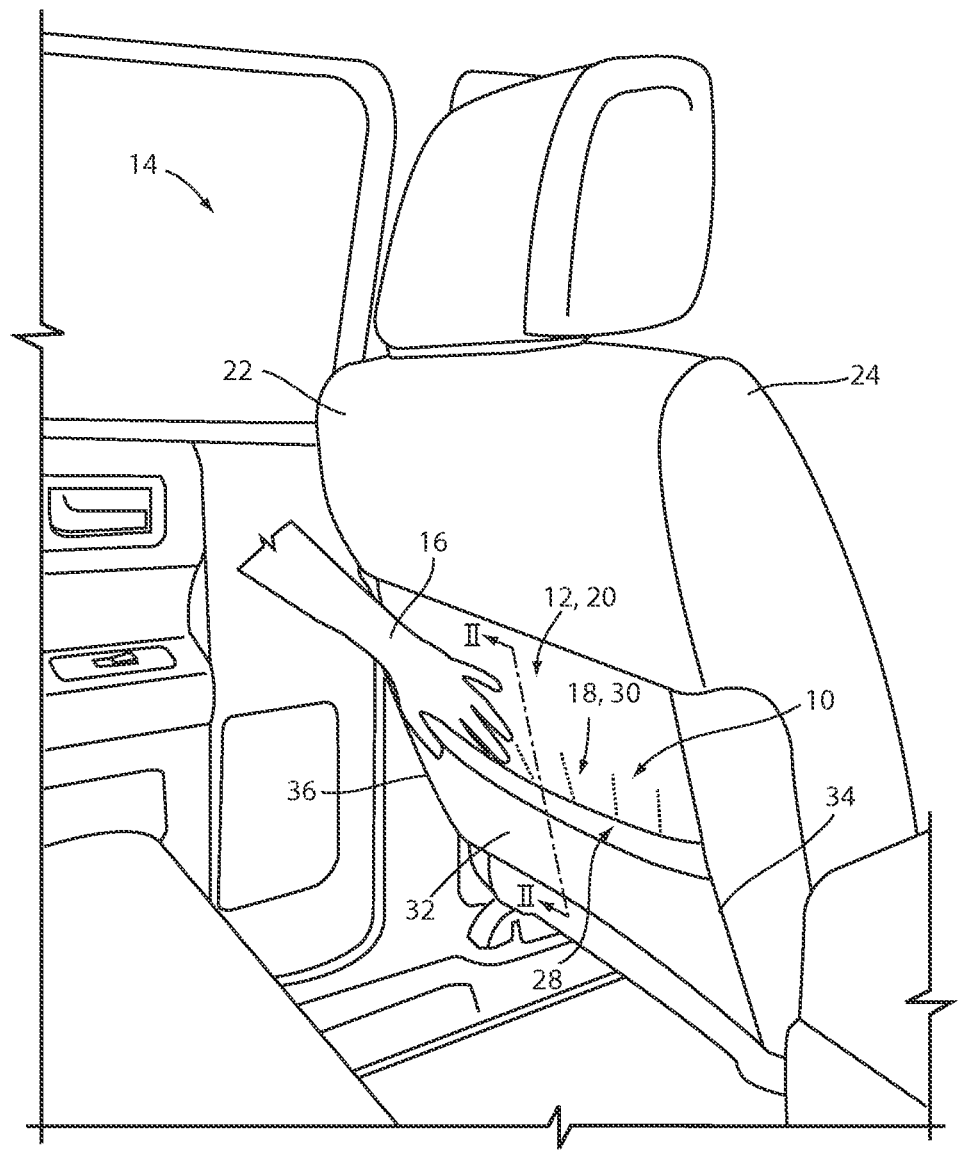
FIG. 1 is a perspective view of storage compartment of an automotive vehicle demonstrating an illumination apparatus.
Figure 2:
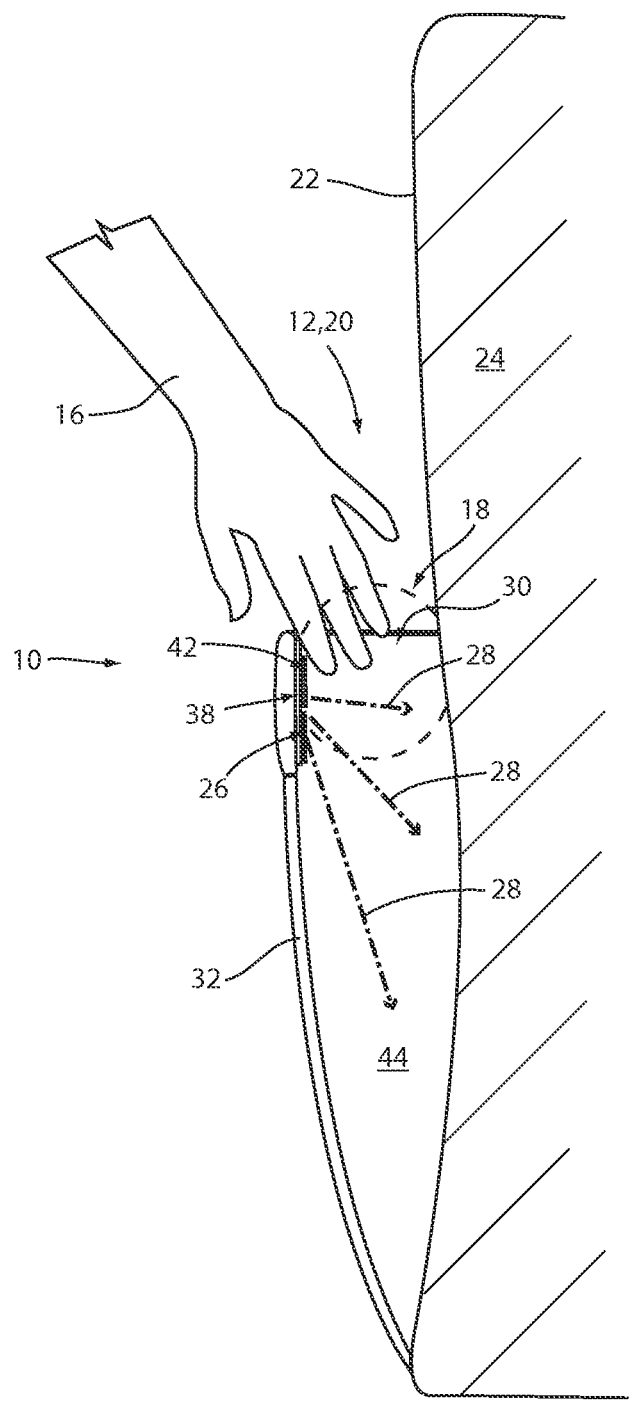
FIG. 2 is a side cross-sectional view of an illumination apparatus configured to selectively illuminate an interior cavity of a storage compartment.

Referring to FIGS. 1 and 2, the disclosure describes an illumination apparatus 10 for a vehicle configured to illuminate at least a portion of a storage compartment 12. FIG. 1 illustrates a perspective view of a vehicle interior 14. FIG. 2 is a side cross-sectional view of the storage compartment 12 and the illumination apparatus 10 along section line 1-1. As demonstrated in the exemplary embodiments of the application, the illumination apparatus 10 may be utilized to illuminate at least a portion of the storage compartment 12. In some implementations, the illumination apparatus 10 may be configured to selectively illuminate the storage compartment 12. The selective illumination may be in response to an object 16 entering an access region 18 of the storage compartment 12.

The storage compartment 12 may correspond to a storage pocket 20 or seatback pocket, which may be disposed in a seatback portion 22 of a passenger seat 24. Though discussed in reference to the seatback portion 22, the illumination apparatus 10 may be implemented in various locations of the vehicle. For example, the illumination apparatus 10 may be configured to be disposed in various panels, consoles, trim portions, etc. The illumination apparatus 10 may be implemented in various interior and/or exterior panels of the vehicle and may generally be configured to illuminate portions of the vehicle that may not otherwise be sufficiently illuminated by conventional utility lights, dome lights and/or map lights.

The illumination apparatus 10 may include a light producing assembly 26 corresponding to a thin, flexible lighting assembly. For purposes of this disclosure, a vehicle fixture or panel may refer to any interior or exterior piece of vehicle equipment, or a part thereof, suitable for receiving the illumination apparatus 10 as described herein. While the implementations of the illumination apparatus 10 described herein are primarily directed towards automotive vehicle use, it should be appreciated that the apparatus or system may also be implemented in other types of vehicles designed to transport one or more passengers such as, but not limited to, watercraft, aircraft, trains, mass transit, etc.

The light producing assembly 26 may be operable to emit an output emission 28 of light to illuminate at least a portion of the storage compartment 12. The output emission 28 of light is demonstrated by the dashed lines extending from the light producing assembly 26. The light producing assembly 26 may have a thin profile and be of flexible materials providing for the assembly to conform to non-planar surfaces. In some implementations, the storage pocket 20 may form a slot-like opening 30 between the seatback portion 22 and an outer wall 32 connected to the seatback portion 22 along a first edge 34 and a second edge 36. The outer wall 32 may be of a rigid or flexible material such that the storage compartment 12 or at least the opening 30 may be substantially rigid or flexible to suit a desired design or form to suit various storage needs and design considerations. In implementations that utilize substantially flexible material, the outer wall 32 may be referred to as a flap or pocket flap. Although specific examples of the illumination apparatus 10 are discussed in reference to the storage pocket 20 or seatback pocket, it should be appreciated that the illumination apparatus 10 may be implemented in other portions of the vehicle. For example, the storage compartment 12 may be utilized and/or formed as a portion of various panels, consoles, and trim portions of the vehicle.

In an exemplary embodiment, the light producing assembly 26 is in communication with a controller, which may form a portion of a circuit 38 configured to detect the object 16 entering an access region 18 of the storage compartment 12. The circuit 38 may extend significantly along the opening 30 from the first edge 34 and a second edge 36. In this configuration, the circuit 38 may comprise a at least one proximity sensor 42 or presence sensor configured to detect the object 16 in the access region 18 of the storage compartment 12. The illumination apparatus 10 may be configured to selectively illuminate at least a portion of an interior cavity 44 formed by the storage compartment 12 in response to the detection of the object 16 communicated to the controller by the at least one proximity sensor 42. The at least one proximity sensor 42 may correspond to a variety of types of sensors configured to detect a presence and/or proximity of the object. In an exemplary implementation, the at least one proximity sensor 42 may correspond to a capacitive sensor or capacitive sensor array printed on the circuit 38.

The controller may be in communication with various control modules and systems of the vehicle such that the controller may selectively illuminate the illumination apparatus 10 to correspond to one or more states of the vehicle. A state of the vehicle may correspond to at least one of a locked/unlocked condition, a lighting condition, a driving condition, a drive gear selection, a door ajar condition, or any other condition that may be sensed by various control modules and systems of the vehicle. The various configurations of the illumination apparatus may provide for beneficial lighting configured to illuminate at least a portion of one or more storage compartments 12 of the vehicle.

Figure 3:
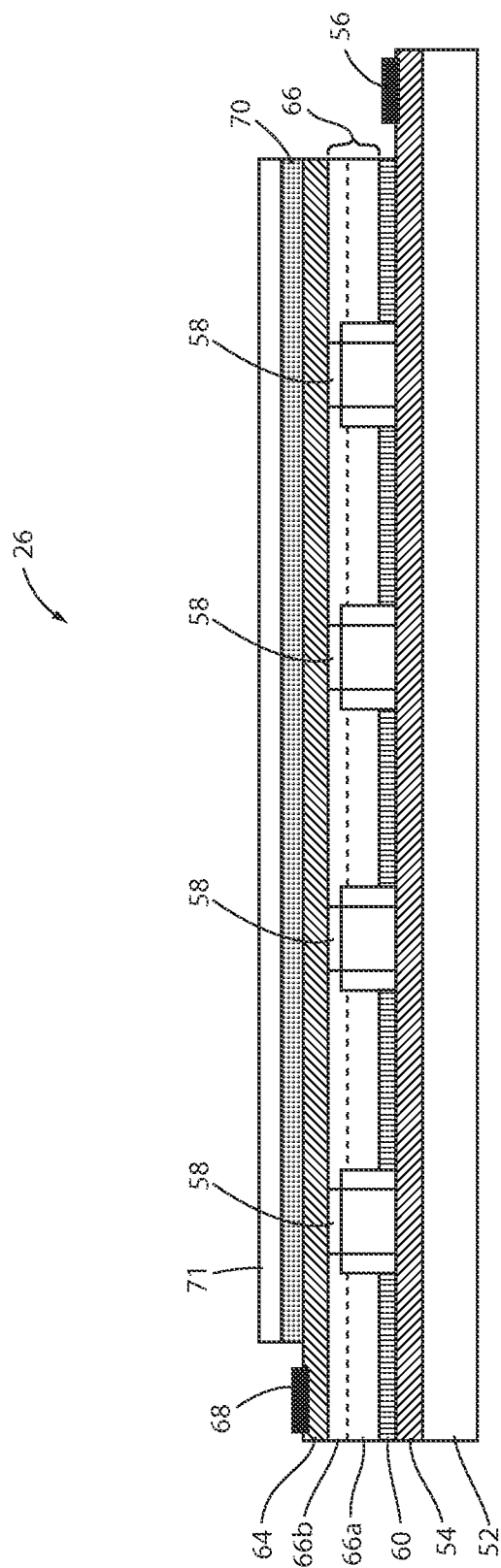
FIG. 3 is a detailed side view of a light producing assembly comprising a photoluminescent layer.

Referring to FIG. 3, the light producing assembly 26 may correspond to a thin-film or printed light emitting diode (LED) assembly. The light producing assembly 26 may comprise a substrate 52, which may correspond to a substrate of the circuit 38. The substrate 52 may be opaque, transparent, or semi-transparent and may be thin. The light producing assembly 26 may be utilized in a variety of applications, which may have a thin overall thickness. The substrate 52 may be of a polymer, for example polycarbonate, poly-methyl methacrylate (PMMA), polyethylene terephthalate (PET), etc. In some embodiments, the substrate 52 may be dispensed from a roll to provide for integration into assembly operations for the light producing assembly 26 and may be approximately 0.1 mm to 1.5 mm thick.

A first electrode 54 or conductive layer may be disposed on the substrate 52. The first electrode 54 and/or various electrodes or conductive layers discussed herein may comprise a conductive epoxy, such as a silver-containing or copper-containing epoxy. The first electrode 54 may be conductively connected to a first bus bar 56. The first bus bar 56 and other bus bars or conduits discussed herein may be of metallic and/or conductive materials which may be screen printed on the electrodes or conductive layers. The bus bars may be utilized in the light producing assembly 26 to conductively connect a plurality of light-emitting diode (LED) sources 58 to a power source via the controller. In this way, the first bus bar 56, and other bus bars utilized in the light producing assembly, may be configured to uniformly deliver current along and/or across a surface of the light producing assembly 26.

The LED sources 58 may be printed, dispersed or otherwise applied to the first electrode 54 via a semiconductor ink 60. The semiconductor ink may correspond to a liquid suspension comprising a concentration of LED sources 58 dispersed therein. The concentration of the LED sources may vary based on a desired emission intensity of the light producing assembly 26. The LED sources 58 may be dispersed in a random or controlled fashion within the semiconductor ink 60. The LED sources 58 may correspond to micro-LEDs of gallium nitride elements, which may be approximately 5 microns to 400 microns across a width substantially aligned with the surface of the first electrode. The semiconductor ink 60 may include various binding and dielectric materials including but not limited to one or more of gallium, indium, silicon carbide, phosphorous and/or translucent polymeric binders. In this configuration, the semiconductor ink 60 may contain various concentrations of LED sources 58 such that a surface density of the LED sources 58 may be adjusted for various applications.

In some embodiments, the LED sources 58 and semiconductor ink 60 may be sourced from Nth Degree Technologies Worldwide Inc. The semiconductor ink 60 can be applied through various printing processes, including ink jet and silk screen processes to selected portion(s) of the substrate 52. More specifically, it is envisioned that the LED sources 58 are dispersed within the semiconductor ink 60, and shaped and sized such that a substantial quantity of them preferentially align with the first electrode 54 and a second electrode 64 during deposition of the semiconductor ink 60. The portion of the LED sources 58 that ultimately are electrically connected to the electrodes 54, 64 may be illuminated by a voltage source applied across the first electrode 54 and the second electrode 64. In some embodiments, a power source operating at 12 to 16 VDC from a vehicular power source may be employed as a power source to supply current to the LED sources 58. Additional information regarding the construction of a light producing assembly similar to the light producing assembly 26 is disclosed in U.S. Pat. No. 9,299,887 to Lowenthal et al., entitled "ULTRA-THIN PRINTED LED LAYER REMOVED FROM SUBSTRATE," filed Mar. 12, 2014, the entire disclosure of which is incorporated herein by reference.

At least one dielectric layer 66 may be printed over the LED sources 58 to encapsulate and/or secure the LED sources 58 in position. The at least one dielectric layer 66 may correspond to a first dielectric layer 66a and a second dielectric layer 66b, which may be of a substantially transparent material. The second electrode 64 may correspond to a top transparent conductor layer printed over the dielectric layer 66 to electrically connect the electrodes 54, 64. The second electrode 64 may be conductively connected to a second bus bar 68. The bus bars 56, 68 may be utilized in the light producing assembly 26 to conductively connect a plurality of light-emitting diode (LED) sources 58 to the power source via the controller. Though the plurality of LED are discussed in connected to the controller via the bus bars 56, 68, in some embodiments, the controller may supply current to the LED sources 58 via various forms of conductive leads or traces configured to conductively connect the controller to the first electrode 54 and the second electrode 64.

In some embodiments, the first electrode 54 and the second electrode 64 may correspond to a cathode electrode and an anode electrode, respectively. Though described as a cathode and an anode of the light producing assembly 26, the first electrode 54 and the second electrode 64 may be arranged such that the second electrode 64 (anode) is disposed on the substrate and the first electrode 54 cathode is disposed on the at least one dielectric layer 66. Additionally, a reflective layer which may be of a metallic reflective material may be disposed between the substrate 52 and the first electrode to reflect light emitted from the anode outward from the substrate 52 through the second electrode 64. The bus bars 56, 68 may be printed along opposite edges of the electrodes 54, 64 and electrically terminate at anode and cathode terminals. Points of connection between the bus bars 56, 68 and the power source may be at opposite corners of each bus bar 56, 68 for uniform current distribution along each bus.

Still referring to FIG. 3, in some embodiments, a photoluminescent layer 70 may be applied to the second electrode 64 to form a backlit configuration of the light producing assembly 26. In some embodiments, the photoluminescent layer may alternatively or additionally be configured in a front-lit configuration. Further discussion of the backlit configuration, the front-lit configuration, and combinations thereof are further discussed in reference to FIGS. 5 and 6.

In various implementations, the photoluminescent layer 70 may be applied as a coating, layer, film, and/or photoluminescent substrate to the second electrode or any surface of the light producing assembly 26 configured to emit the output emission 28 therethrough. A photoluminescent portion may be also be disposed on a surface of the interior cavity 44 to illuminate the storage compartment 12 in a front-lit configuration. The photoluminescent layer 70 may be applied by screen printing, flexography, and/or otherwise affixed to the second electrode 64 and/or the surface of the interior cavity 44.

In various implementations, the LED sources 58 may be configured to emit an excitation emission comprising a first wavelength corresponding to blue light. The LED sources 58 may be configured to emit the excitation emission into the photoluminescent layer 70 such that the photoluminescent material becomes excited. In response to the receipt of the excitation emission, the photoluminescent material converts the excitation emission from the first wavelength to an output emission 28 comprising at least a second wavelength longer than the first wavelength. Additionally, one or more coatings 71 or sealing layers may be applied to an exterior surface of the light producing assembly 26 to protect the photoluminescent layer 70 and various other portions of the light producing assembly 26 from damage and wear.

Figure 4:
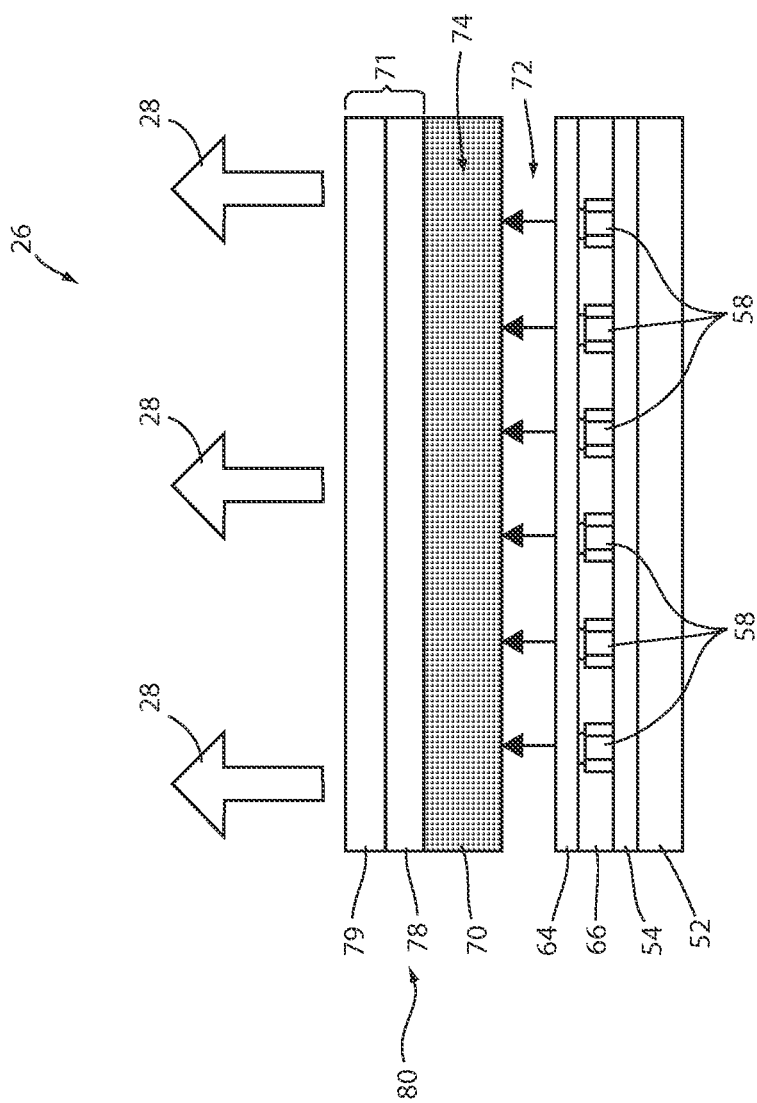
FIG. 4 is a side view of a light producing assembly demonstrating a photoluminescent layer configured to convert a wavelength of light.

Referring now to FIG. 4, a detailed view of photoluminescent layer 70 of the light producing assembly 26 in a backlit configuration is shown. The light producing assembly 26 is configured similar to the light producing assembly 26 demonstrated in FIG. 3, with like-numbered elements having the same or comparable function and structure. Though not shown in FIG. 4, the LED sources 58 are in electrical communication with the electrodes 54, 64 and a power source via the controller such that an excitation emission may be output from LED sources 58.

In an exemplary implementation, the excitation emission 72 may correspond to an excitation emission having a first wavelength corresponding to a blue, violet, and/or ultraviolet spectral color range. The blue spectral color range comprises a range of wavelengths generally expressed as blue light (~440-500 nm). In some implementations, the first wavelength $\lambda_1$ may comprise a wavelength in the ultraviolet and near ultraviolet color range (~100-450 nm). In an exemplary implementation, the first wavelength may be approximately equal to 470 nm. Though particular wavelengths and ranges of wavelengths are discussed in reference to the first wavelength, the first wavelength may generally be configured to excite any photoluminescent material.

In operation, the excitation emission 72 is transmitted into an at least partially light transmissive material of the photoluminescent layer 70. The excitation emission is emitted from the LED sources 58 and may be configured such that the first wavelength corresponds to at least one absorption wavelength of one or more photoluminescent materials disposed in the photoluminescent layer 70. For example, the photoluminescent layer 70 may comprise an energy conversion layer 74 configured to convert the excitation emission 72 at the first wavelength to an output emission 28 having a second wavelength, different from the first wavelength. The output emission 28 may comprise one or more wavelengths, one of which may be longer than the first wavelength. The conversion of the excitation emission 72 to the output emission 28 by the energy conversion layer 74 is referred to as a Stokes shift.

In some embodiments, the output emission 28 may correspond to a plurality of wavelengths. Each of the plurality of wavelengths may correspond to significantly different spectral color ranges. For example, the at least second wavelength of the output emission 28 may correspond to a plurality of wavelengths (e.g. second, third, etc.). In some implementations, the plurality of wavelengths may be combined in the output emission 28 to appear as substantially white light. The plurality of wavelengths may be generated by a red-emitting photoluminescent material having a wavelength of approximately 620-750 nm, a green emitting photoluminescent material having a wavelength of approximately 526-606 nm, and a blue or blue green emitting photoluminescent material having a wavelength longer than the first wavelength $\lambda_1$ and approximately 430-525 nm. In some implementations, a blue or blue green wavelength may correspond to the excitation emission being combined with the output emission 28. As discussed herein, a concentration of the photoluminescent material may be configured to allow at least a portion of the excitation emission to be emitted with the output emission 28 to add a blue hue to the output emission 28. The plurality of wavelengths may be utilized to generate a wide variety of colors of light from the each of the photoluminescent portions converted from the first wavelength. Though the particular colors of red, green, and blue are referred to herein, various photoluminescent materials may be utilized to generate a wide variety of colors and combinations to control the appearance of the output emission 28.

The photoluminescent materials, corresponding to the photoluminescent layer 70 or the energy conversion layer 74, may comprise organic or inorganic fluorescent dyes configured to convert the excitation emission 72 to the output emission 28. For example, the photoluminescent layer 70 may comprise a photoluminescent structure of rylenes, xanthenes, porphyrins, phthalocyanines, or other materials suited to a particular Stokes shift defined by an absorption range and an emission fluorescence. In some embodiments, the photoluminescent layer 70 may be of at least one inorganic luminescent material selected from the group of phosphors. The inorganic luminescent material may more particularly be from the group of Ce-doped garnets, such as YAG:Ce. As such, each of the photoluminescent portions may be selectively activated by a wide range of wavelengths received from the excitation emission 72 configured to excite one or more photoluminescent materials to emit an output emission having a desired color.

Still referring to FIG. 4, the light producing assembly 26 may further include the coating 71 as at least one stability layer 78 configured to protect the photoluminescent material contained within the energy conversion layer 74 from photolytic and/or thermal degradation. The stability layer 78 may be configured as a separate layer optically coupled and adhered to the energy conversion layer 74. The stability layer 78 may also be integrated with the energy conversion layer 74. The photoluminescent layer 70 may also optionally include a protection layer 79 optically coupled and adhered to the stability layer 78 or any layer or coating to protect the photoluminescent layer 70 from physical and chemical damage arising from environmental exposure.

The stability layer 78 and/or the protection layer 79 may be combined with the energy conversion layer 74 to form an integrated photoluminescent structure 80 through sequential coating or printing of each layer, or by sequential lamination or embossing. Additionally, several layers may be combined by sequential coating, lamination, or embossing to form a substructure. The substructure may then be laminated or embossed to form the integrated photoluminescent structure 80. Once formed, the photoluminescent structure 80 may be applied to a surface of at least one of the electrodes 54, 64 such that the excitation emission 72 received from the LED sources 58 and converted to the output emission 28. Additional information regarding the construction of photoluminescent structures to be utilized in at least one photoluminescent portion of a vehicle is disclosed in U.S. Pat. No. 8,232,533 to Kingsley et al., entitled "PHOTOLYTICALLY AND ENVIRONMENTALLY STABLE MULTILAYER STRUCTURE FOR HIGH EFFICIENCY ELECTROMAGNETIC ENERGY CONVERSION AND SUSTAINED SECONDARY EMISSION," filed Nov. 8, 2011, the entire disclosure of which is incorporated herein by reference.

Figure 5:
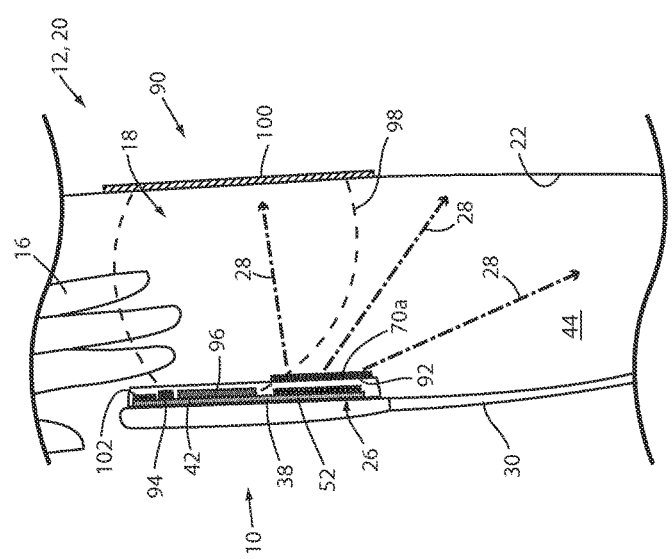
FIG. 5 is a detailed cross-sectional view of a an illumination apparatus configured to selectively illuminate an interior cavity of a storage compartment in a backlit configuration.

Referring now to FIG. 5, the illumination apparatus 10 is shown in a backlit configuration 90. The light producing assembly 26 may be operable to emit the excitation emission 72 to excite the photoluminescent portion 70a to emit the output emission 28. In this configuration, the light assembly may illuminate at least a portion of the storage compartment 12. The output emission 28 of light is demonstrated by the dashed lines extending from the light producing assembly 26. In the backlit configuration 90, the excitation enters the at least partially light transmissive material disposed proximate an outer surface 92 of the light producing assembly 26. Inside the photoluminescent portion 70a, the first wavelength of the excitation emission 72 is converted by the photoluminescent material to the second wavelength of the output emission 28.

The light producing assembly 26 may form an integral portion of the circuit 38 of the illumination apparatus. In some embodiments, the light producing assembly 26, the at least one proximity sensor 42, and/or the controller 94 may be incorporated in the circuit 38 to form a substantially flexible assembly of the illumination apparatus 10. The illumination apparatus 10 may be utilized to illuminate the interior cavity 44 formed by the storage compartment 12 in response to the detection of the object 16 communicated to the controller 94 by the at least one proximity sensor 42. In this configuration the storage compartment 12 may be of a substantially flexible material configured to flex and accommodate to the object 14 entering the interior cavity 44 and conform to various items that may be stored therein. By providing for the lighting apparatus to be substantially flexible, the disclosure allows for the storage compartment 12 or the storage pocket 20 to bend and flex to allow users to access the interior cavity 44 while improving a visibility of objects stored therein by illuminating at least a portion of the interior cavity 44 with the output emission 28.

The at least one proximity sensor 42 may correspond to various forms of proximity sensors and/or presence sensors. In some embodiments, the proximity sensor 42 corresponds to a capacitive sensor, which may be printed or otherwise attached to the surface of the circuit 38. In an exemplary embodiment, the proximity sensor 42 may correspond to a printed capacitive sensor 96 formed by printing conductive ink onto a surface of the circuit 38 or substrate 52. The printed capacitive sensor 96 may generally have a drive electrode and a receive electrode each forming interdigitated fingers for generating a capacitive field 98. It should be appreciated that the at least one proximity sensor 42 may be formed by assembling preformed conductive circuit traces onto the substrate 52 and/or printing the traces on the substrate 52. In this configuration, the illumination apparatus 10 may be configured to selectively illuminate at least a portion of the interior cavity 44 in response to the detection of the object 16 communicated to the controller 94 by the at least one proximity sensor 42.

The capacitive field 98 may correspond to a sensory field or sensory region corresponding to the access region 18. The capacitive field 98 may be limited and controlled in its extents to prevent unintended activation of the output emission 28. In order to control the extents of the capacitive field 98, the illumination apparatus may further comprise an absorption plate 100 disposed on or proximate to the seatback portion 22 and a ground strip 102 disposed on or printed on the circuit 38. The absorption plate 100 and the ground strip may correspond to conductive materials in connection with a ground of the circuit or any ground which may limit the extent of the capacitive field 98. In this way, the illumination apparatus may be operable to limit the extents of the sensory region to control a sensitivity of the at least one proximity sensor 42 to control the activation of the lighting producing assembly 26.

Figure 6:
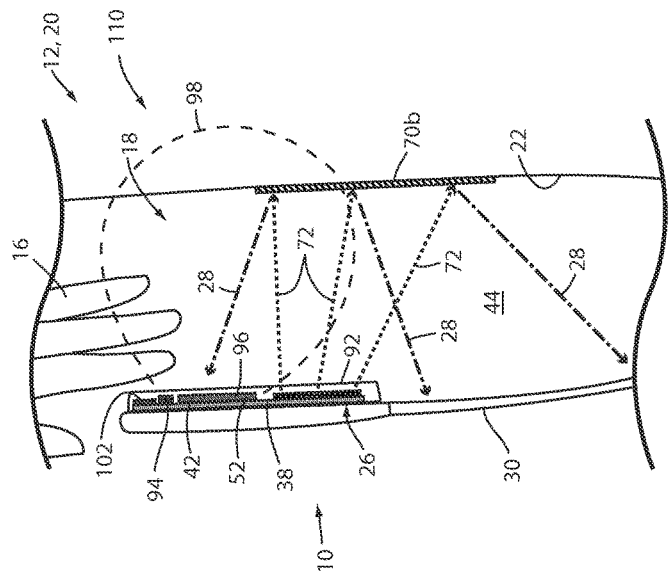
FIG. 6 is a detailed cross-sectional view of a an illumination apparatus configured to selectively illuminate an interior cavity of a storage compartment in a front-lit configuration.

Referring now to FIG. 6, the illumination apparatus 10 is shown in a front-lit configuration 110. The light producing assembly 26 may be operable to emit the excitation emission 72 to excite the photoluminescent portion 70b to emit the output emission 28. In this configuration, the excitation emission 72 may be emitted from the light assembly and be transmitted through at least a portion of the volumetric space formed by the storage compartment 12 between the outer wall 32 and the seatback portion 22. The excitation emission 72 is shown in FIG. 6 by the dotted lines extending from the light producing assembly 26 to the photoluminescent portion 70b disposed on the seatback portion 22. The output emission 28 of light is demonstrated by the dashed lines extending from the light producing assembly 26.

In the front-lit configuration 110, the excitation emission 72 is emitted from the light producing assembly 26 and impinges upon a surface of the photoluminescent portion 70b. The photoluminescent portion 70b may absorb the excitation emission 72 at the first wavelength such that the photoluminescent material therein becomes excited and emits the output emission 28 at the second wavelength. In this configuration, the excitation emission 72 may be substantially less visible than the output emission 28 such that the light illuminating the interior cavity 44 appears to originate from the photoluminescent portion 70b. Additionally, in some embodiments, the backlit configuration 90 and the front-lit configuration 110 may be utilized in combination by emitting an output emission and an excitation emission from the light assembly.

Figure 7:
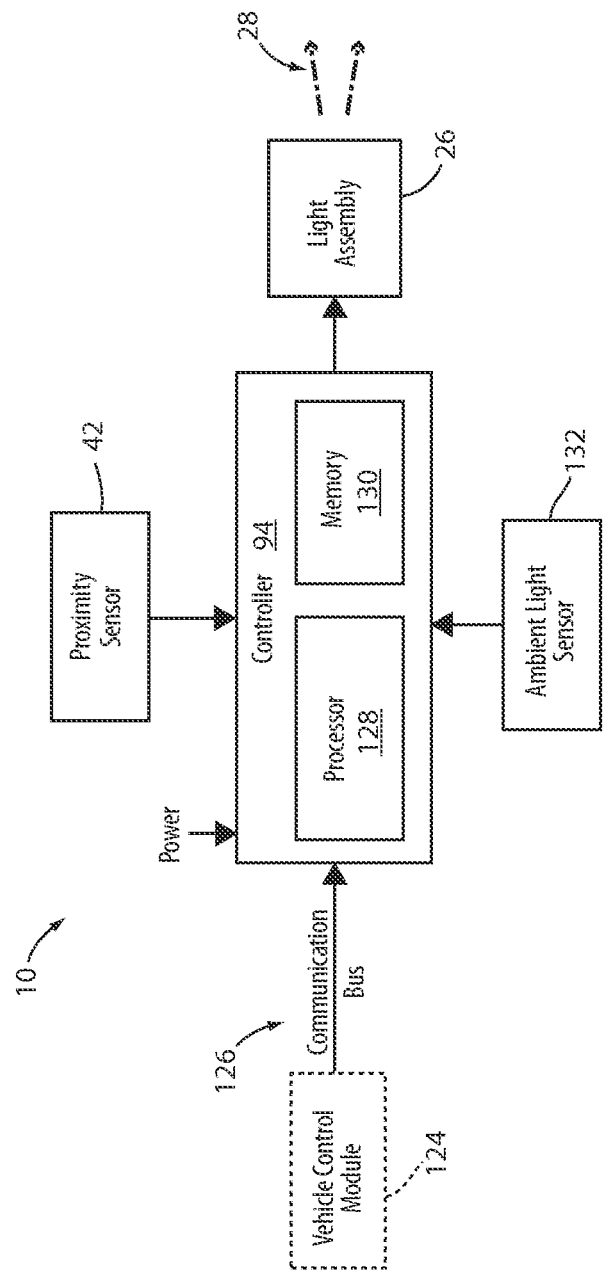
FIG. 7 is a block diagram of an illumination apparatus in accordance with the disclosure.

Referring to FIG. 7, a block diagram corresponding to the illumination apparatus 10 is shown. The controller 94 is in communication with the light producing assembly 26 via the electrical supply busses discussed herein. The controller 94 may be in communication with the vehicle control module 124 via a communication bus 126 of the vehicle. The communication bus 126 may be configured to deliver signals to the controller 94 identifying various vehicle states. For example, the communication bus 126 may be configured to communicate to the controller 94 a drive selection of the vehicle, an ignition state, a door open or ajar status, a remote activation of the illumination apparatus 10, or any other information or control signals that may be utilized to activate or adjust the output emission 28. Though the controller 94 is discussed herein, in some embodiments, the illumination apparatus 10 may be activated in response to an electrical or electro-mechanical switch in response to a position of a closure (e.g. a door, hood, truck lid, etc.) of the vehicle.

The controller 94 may comprise a processor 128 comprising one or more circuits configured to receive the signals from the communication bus 126 and output signals to control the illumination apparatus 10 to control the output emission 28. The processor 128 may be in communication with a memory 130 configured to store instructions to control the activation of the illumination apparatus 10. The controller 94 may further be in communication with an ambient light sensor 132. The ambient light sensor 132 may be operable to communicate a light condition, for example a level brightness or intensity of the ambient light proximate the vehicle. In response to the level of the ambient light, the controller 94 may be configured to adjust a light intensity output from the illumination apparatus 10. The intensity of the light output from the illumination apparatus 10 may be adjusted by the controller 94 by controlling a duty cycle, current, or voltage supplied to the illumination apparatus 10.

The at least one proximity sensor 42 is further in communication with the controller 94. Some non-limiting examples of the at least one proximity sensor may include inductive sensors, optical sensors, resistive sensors, temperature sensors, the like, or a combination thereof. Such sensors may be utilized to detect various objects entering the access region 18 of the illumination apparatus 10 such that the apparatus may be utilized for a variety of applications.

For the purposes of describing and defining the present teachings, it is noted that the terms "substantially" and "approximately" are utilized herein to represent the inherent degree of uncertainty that may be attributed to any quantitative comparison, value, measurement, or other representation. The term "substantially" and "approximately" are also utilized herein to represent the degree by which a quantitative representation may vary from a stated reference without resulting in a change in the basic function of the subject matter at issue.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. An illumination apparatus for a vehicle comprising:
   an at least partially flexible circuit disposed on an inner surface of a storage compartment proximate an access region, wherein the at least partially flexible circuit further comprises a ground strip printed on the flexible circuit;
   a plurality of LEDs suspended in a semiconductor ink printed on the flexible circuit; and
   at least one proximity sensor in communication with a controller via the flexible circuit, wherein the controller is configured to selectively illuminate the LEDs in response to a detection of an object entering an access region by the proximity sensor, wherein the at least partially flexible circuit is oriented relative the access region such that the at least one proximity sensor extends along an opening of a cavity formed by the storage compartment, and wherein the ground strip printed on the flexible circuit extends between an entrance of the opening and the at least one proximity sensor.

2. The illumination apparatus according to claim 1, wherein the at least partially flexible circuit corresponds to a thin film assembly having the plurality of LEDs and the proximity sensor printed thereon.

3. The illumination apparatus according to claim 1, wherein the ground strip is configured to limit a range of a sensory field emitted by the at least one proximity sensor.

4. The illumination apparatus according to claim 1, further comprising at least one photoluminescent portion disposed proximate the plurality of LEDs.

5. The illumination apparatus according to claim 3, wherein the range of the sensory field is limited by the ground strip such that the sensory field extends substantially equidistant to an entrance of the opening of the access region.

6. The illumination apparatus according to claim 4, wherein the plurality of LEDs are configured to emit an excitation emission directed toward the at least one photoluminescent portion.

7. The illumination apparatus according to claim 6, wherein the at least one photoluminescent portion is configured to convert a first wavelength of the first emission to at least a second wavelength longer than the first wavelength to illuminate a cavity formed by the storage compartment.

8. An illumination apparatus for a storage pocket comprising:
a flexible circuit disposed proximate to and extending significantly along an opening of the storage pocket comprising at least one proximity sensor and a plurality of LEDs suspended in a semiconductor ink printed thereon and in communication with a controller, the controller configured to activate an emission from the LEDs in response to the proximity sensor detecting an object entering the storage pocket, and
a ground strip printed on the flexible circuit, the ground strip extending between an entrance of the opening and the at least one proximity sensor.

9. The apparatus according to claim 8, wherein the flexible circuit is configured to substantially conform to an opening of the storage pocket.

10. The apparatus according to claim 8, wherein the storage pocket comprises an access slot forming the opening of the storage pocket.

11. The apparatus according to claim 10, wherein the access slot is formed of a flexible material extending from a first opening edge to a second opening edge.

12. The apparatus according to claim 11, wherein the proximity sensor is configured to monitor a sensory field extending significantly along the opening from the first opening edge to the second opening edge.

13. An illumination apparatus for a vehicle storage cavity comprising:
a circuit disposed proximate and extending significantly along an opening of the cavity and comprising:
at least one proximity sensor extending along the opening; and
a plurality of LEDs suspended in a semiconductor ink printed thereon; and
a ground strip printed on the circuit and extending between an entrance of the opening and the at least one proximity sensor;
wherein the circuit is configured to activate an emission from the LEDs in response to the proximity sensor detecting an object entering the storage cavity.

14. The apparatus according to claim 13, wherein the storage cavity corresponds to a seatback pocket formed of a pliable material connected to a back portion of a passenger seat.

15. The apparatus according to claim 13, further comprising:
a photoluminescent portion disposed on a first surface of the storage pocket, wherein the flexible circuit is disposed on a second surface of the storage pocket.

16. The apparatus according to claim 14, wherein the seatback pocket comprises a slot-like opening formed by an outer wall connected to the seatback along a first edge and a second edge.

17. The illumination apparatus according to claim 14, further comprising a photoluminescent portion disposed proximate the flexible circuit configured to receive an excitation emission from the plurality of LEDs.

18. The apparatus according to claim 15, wherein the plurality of LEDs are configured to emit an excitation emission through the cavity to excite the photoluminescent portion.

* * * * *